(12) United States Patent
Chen et al.

(10) Patent No.: US 7,493,940 B2
(45) Date of Patent: Feb. 24, 2009

(54) HEAT DISSIPATION DEVICE HAVING MOUNTING BRACKETS

(75) Inventors: Chun-Chi Chen, Tu-Cheng (TW); Shi-Wen Zhou, Shenzhen (CN); Guo Chen, Shenzhen (CN); Li He, Shenzhen (CN); Peng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 156 days.

(21) Appl. No.: 11/309,841

(22) Filed: Oct. 10, 2006

(65) Prior Publication Data

US 2008/0083528 A1 Apr. 10, 2008

(51) Int. Cl.
*F24H 3/02* (2006.01)
*F28F 9/00* (2006.01)
*H05K 7/20* (2006.01)

(52) U.S. Cl. .................. 165/121; 165/80.3; 165/67

(58) Field of Classification Search ............ 165/80.3, 165/185, 121, 67, 76, 104.34; 361/695, 697; 257/722, 726, 727
See application file for complete search history.

(56) References Cited

U.S. PATENT DOCUMENTS

| | | | |
|---|---|---|---|
| 5,486,980 A | 1/1996 | Jordan et al. | |
| 5,706,169 A * | 1/1998 | Yeh | 361/690 |
| 6,311,766 B1 * | 11/2001 | Lin et al. | 165/80.3 |
| 6,396,697 B1 * | 5/2002 | Chen | 361/704 |
| 6,640,882 B2 * | 11/2003 | Dowdy et al. | 165/80.3 |
| 6,654,246 B2 | 11/2003 | Wu | |
| 6,722,418 B2 * | 4/2004 | Zhang | 165/80.3 |
| 6,894,898 B2 * | 5/2005 | Liu | 361/697 |
| 6,950,306 B2 * | 9/2005 | Huang et al. | 361/697 |
| 7,289,330 B2 * | 10/2007 | Lu et al. | 361/710 |

* cited by examiner

*Primary Examiner*—Tho v Duong
(74) *Attorney, Agent, or Firm*—Jeffrey T. Knapp

(57) ABSTRACT

A heat dissipation device (100) includes a heat sink (10) having a plurality of fins (14) and a plurality of mounting brackets (20) buckled with the fins of the heat sink. Each of the mounting brackets includes a mounting plate (22) mounted on a top of the heat sink and a baffle plate (26) extending from one side of the mounting plate to a bottom of the heat sink. The baffle plate terminates with a retaining plate (28). A plurality of fasteners (50) extends through the retaining plates to mount the heat dissipation device onto a printed circuit board. Self-tapping screws (40) are used to extend through the fan and the mounting plates of the mounting brackets and threadedly engage with the fins thereby mounting the fan on the heat sink.

15 Claims, 4 Drawing Sheets

HEAT DISSIPATION DEVICE HAVING MOUNTING BRACKETS

CROSS-REFERENCES TO RELATED APPLICATION

This application is related to U.S. patent application Ser. No. 11/164,095 filed on Nov. 22, 2005 and entitled "HEAT SINK ASSEMBLY HAVING A FAN MOUNTING DEVICE"; the co-pending U.S. patent application is assigned to the same assignee as the instant application. The disclosure of the above-identified application is incorporated herein by reference.

1. FIELD OF THE INVENTION

The present invention relates generally to a heat dissipation device, and particularly to a heat dissipation device having a heat sink and mounting brackets which not only can mount a fan on the heat sink but also can mount the heat sink on a board.

2. DESCRIPTION OF RELATED ART

A computer central processing unit (CPU) mounted on a printed circuit board (PCB) is the core administrator of electrical signals in most contemporary personal computers. Continued development of CPUs has enabled them to perform more and more functions. Heat generated by the CPUs has increased enormously. Such heat can adversely affect the operational stability of the computers. Measures must be taken to efficiently remove the heat from the CPU.

Typically, a heat sink assembly is mounted on the PCB and contacts the CPU to dissipate heat generated by the CPU. The heat sink assembly comprises a heat sink having a heat spreader and a plurality of fins mounted on the heat spreader. A pair of fan covers are mounted on a top of the heat sink at opposite sides of the heat sink by screws extending through the fan covers and threadedly engaging with fins of the heat sink. The fan covers are used for mounting a fan on the heat sink to provide forced airflow to the heat sink. A pair of frames is attached to opposite sides of the heat spreader of the heat sink. A plurality of fasteners extend through the frames and the PCB for mounting the heat sink assembly on the PCB.

However, the process of mounting the fan covers need to form holes in the fan covers and outmost fins of the opposite sides of the heat sink, which is unduly time-consuming and inconvenient. Furthermore, the separate forming of the fan covers and the frames increases the production cost of the heat sink assembly.

Therefore, it is desirable to provide a heat dissipation device having a plurality of mounting bracket for facilitating to firmly fasten a fan to a heat sink and to mount the heat dissipation device on a printed circuit board.

SUMMARY OF THE INVENTION

According to a preferred embodiment of the present invention, A heat dissipation device includes a heat sink having a plurality of fins and a plurality of mounting brackets buckled with the fins of the heat sink. Each of the mounting brackets includes a mounting plate mounted on a top of the heat sink for mounting a fan onto the heat sink and a baffle plate extending from one side of the mounting plate to a bottom of the heat sink. The baffle plate terminates with a retaining plate bent from a bottom end of the baffle plate. A plurality of fasteners extends through the retaining plates of the mounting brackets without interference with the fins to mount the heat dissipation device onto a printed circuit board. Self-tapping screws extend through the fan and the mounting plates to threadedly engage with the fins of the heat sink, thereby mounting the fan on the heat sink.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
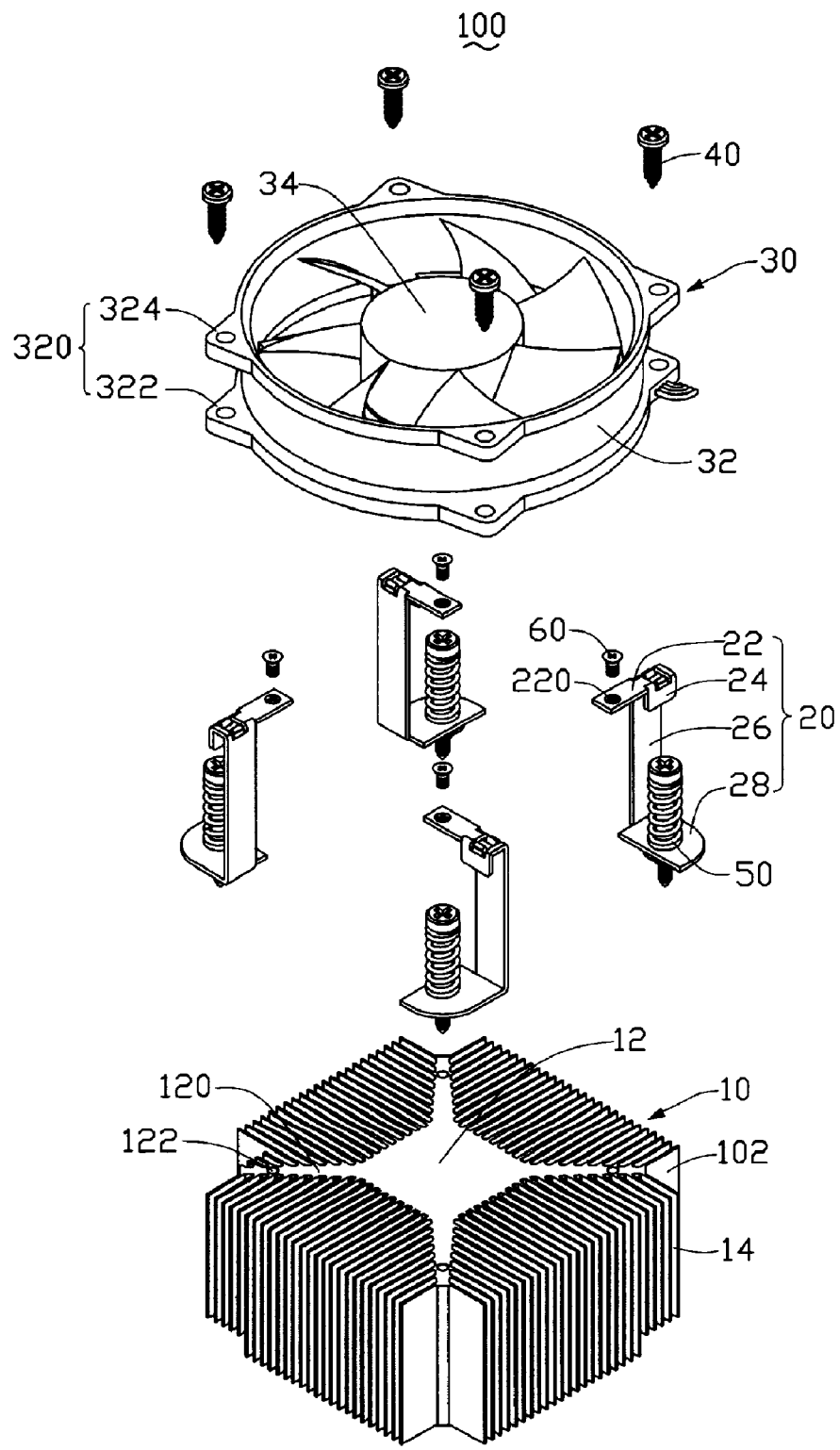
FIG. 1 is an exploded, isometric view of a heat dissipation device according to a preferred embodiment of the present invention.

Referring to FIG. 1, a heat dissipation device 100 according to a preferred embodiment of the present invention comprises a heat sink 10, a plurality of mounting brackets 20 and a fan 30. The mounting brackets 20 are used for mounting the fan 30 on the heat sink 10 and mounting the heat dissipation device 100 on a PCB (not shown).

The heat sink 10 comprises a solid core 12 shaped similar to a cube and four symmetrical branches 120 extending outwardly from four corners of the core 12. A plurality of fins 14 projects outwardly from side surfaces of the core 12 and the branches 120. The fins 14 can be divided into four groups oriented at four different directions. Four side surfaces of the core 12 and the four branches 120 form four regions. Each group of the fins 14 is formed at a corresponding region. Two neighboring groups of the fins 14 are oriented perpendicularly to each other. A mounting space 102 is formed between two neighboring groups of the fins 14, for receiving a corresponding one of the mounting brackets 20 with a fastener 50 therein. Two adjacent outermost fins 14 of the two neighboring groups of the fins 14 form an included angle of 90 degrees therebetween.

Figure 2:
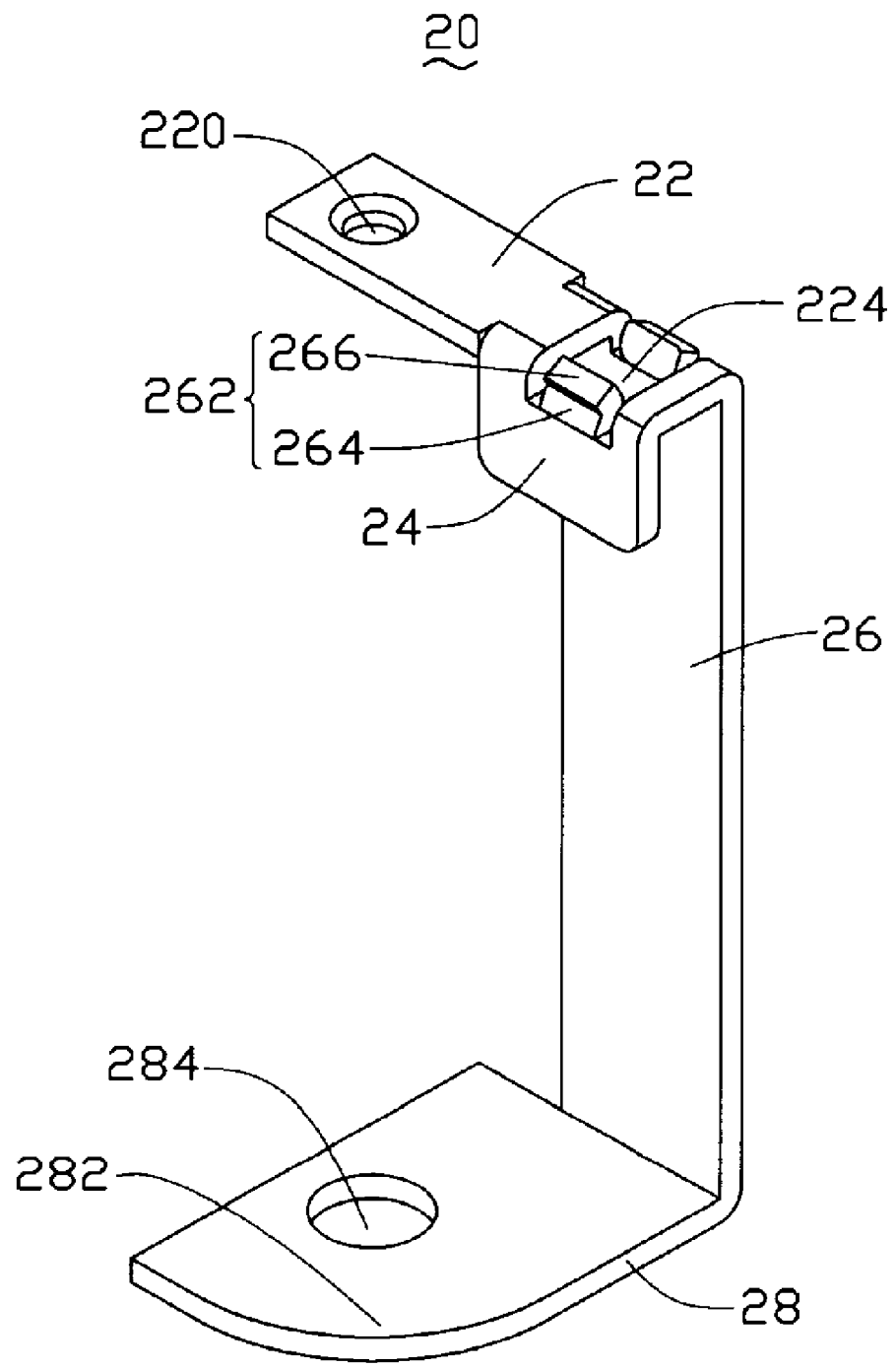
FIG. 2 is an enlarged view of a mounting bracket of the heat dissipation device of FIG. 1.
Figure 3:
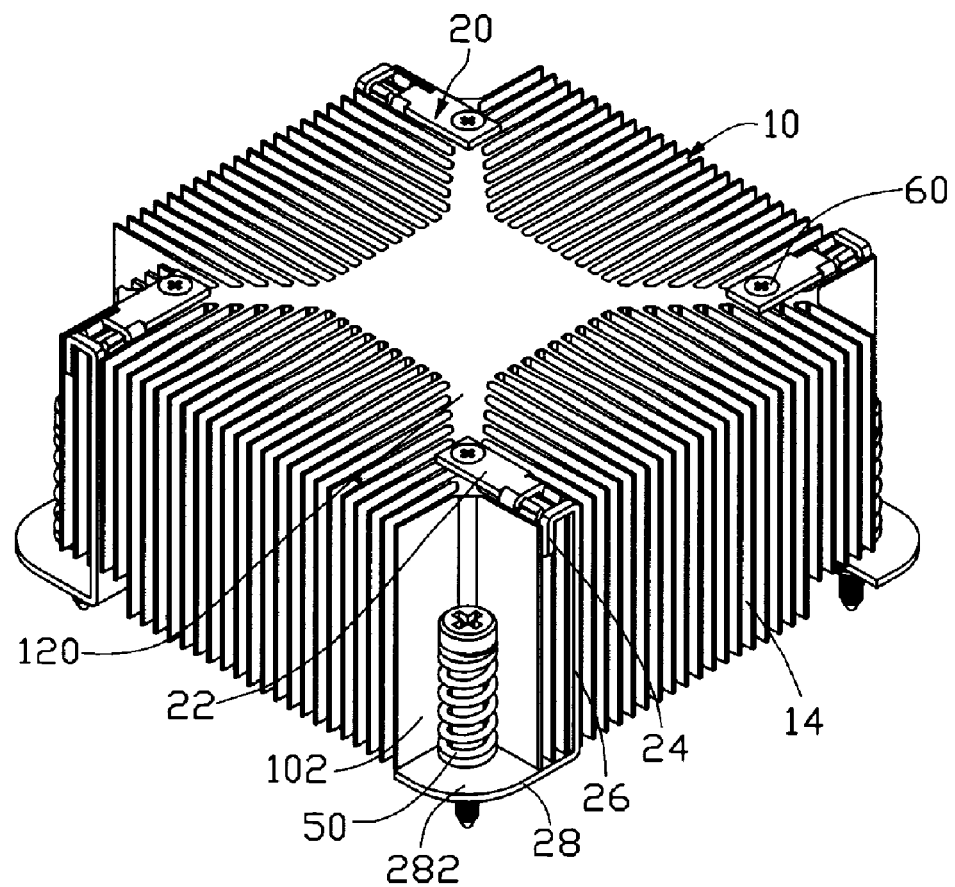
FIG. 3 is an assembled view of the mounting brackets and a heat sink of the heat dissipation device of FIG. 1.

Also referring to FIGS. 2 and 3, each of the mounting brackets 20 buckled with the fins 14 can be formed by stamping a single piece of metal, and comprises a mounting plate 22 having a pair of longitudinal edges, a block portion 24 perpendicularly extending from one of the longitudinal edges of the mounting plate 22, an elongated baffle plate 26 perpendicularly extending from the other longitudinal edge of the mounting plate 22 and a retaining plate 28 perpendicularly extending from a lower end of the baffle plate 26. The mounting plate 22 is mounted on a top of two adjacent fins 14 of one group of the fins 14, wherein the two adjacent fins 14 are adjacent to an outmost fin 14 of the one group of the fins 14. The mounting plate 22 has an enough length to extend on the branch 120 of the heat sink 10. The branch 120 defines a threaded hole 122 therein. The mounting plate 22 defines a locating hole 220 adjacent to an inner free end thereof, corresponding to the threaded hole 122 of the branch 120. A screw 60 extends through the locating hole 220 of the mounting plate 22 to be screwedly engaged in the threaded hole 122 of the heat sink 10, thereby mounting the mounting plate 22 of the mounting bracket 20 on the top of the heat sink 10. The mounting plate 22 defines an opening 224 adjacent to extremities of the two adjacent fins 14 and communicating with a space between the two adjacent fins 14. The block portion 24 and the baffle plate 26 are extended from a base end of the mounting plate 22, for clasping the two adjacent fins 14 therebetween. The baffle plate 26 has a height similar to that of the fins 14 and larger than that of the block portion 24. The block portion 24 and the baffle plate 26 are parallel and opposite to each other with inner surfaces thereof abutting against sides of the two adjacent fins 14 facing opposite directions. A width between the opposite inner surfaces of the block portion 24 and the baffle plate 26 is substantially the same as that between the opposite outer surfaces of the two adjacent fins 14 such that the block portion 24 and the baffle plate 26 can clasp the two adjacent fins 14 therebetween for preventing the two adjacent fins 14 from being deformed outwardly during screwing of a self-tapping screw 40 into the space between the two adjacent fins 14. A pair of spring arms 262 extend upwardly from upper edges of the block portion 24 and the baffle plate 26. The spring arms 262 are located at opposite edges of the opening 224 of the mounting plate 22. Each spring arm 262 comprises a lower arm 264 and an upper arm 266. The lower arm 264 is bent inwardly from the upper edge of one of the block portion 24 and the baffle plate 26. The upper arm 266 is bent outwardly from an upper edge of the lower arm 264. A contact ridge (not labeled) is formed at a joint of the lower and upper arms 264, 266 so that the spring arms 262 are spaced more closely than the block portion 24 and the baffle plate 26. The contact ridges of the spring arms 262 are for sandwiching the inserted self-tapping screw 40 therebetween. The retaining plate 28 extends in a direction perpendicular to an extending direction of the mounting plate 22. The mounting plate 22 and the retaining plate 28 are located at the same side of the baffle plate 26. The retaining plate 28 abuts against bottom of the two adjacent fins 14 and extends in the mounting space 102. The retaining plate 28 has two straight sides (not labeled) intersecting with each other at a right angle, and an arc-shaped edge 282 interconnecting two free ends of the two straight sides. A position hole 284 is defined in the retaining plate 282 for permitting passage of the fastener 50 therein. When fitted in the mounting space 102, the arc-shaped edge 282 is located outside of the straight sides of the retaining plate 28.

Again referring to FIG. 1, the fan 30 comprises a circular frame 32 and a motor 34 received in the frame 32. The frame 32 forms four pairs of triangle ears 320 extending outwardly from a circumferential sidewall thereof. Each pair of the ears 320 comprises a lower ear 322 and an upper ear 324 spaced from and opposite to the lower ear 322. A through hole (not labeled) is defined in each ear 322, 324, for permitting passage of the self-tapping screw 40.

Figure 4:
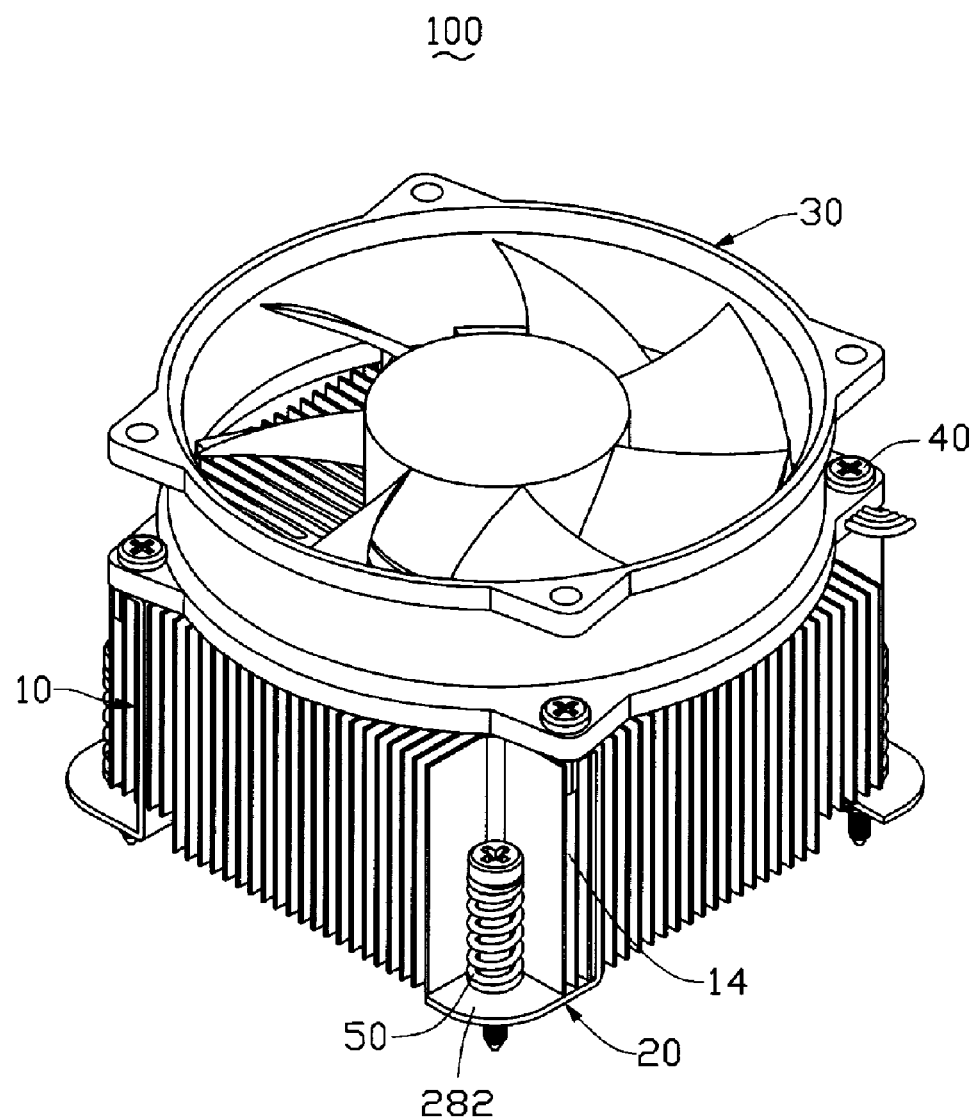
FIG. 4 is an assembled view of FIG. 1.

Referring to FIG. 1 and FIG. 4, in assembly of the heat dissipation device 100, the mounting brackets 20 are mounted at the four regions adjacent to the mounting spaces 102, respectively, in a manner as mentioned above. The screws 60 are brought to extend through the locating holes 220 of the mounting plates 22 of the mounting brackets 20 and screw into the threaded holes 122 of the heat sink 10, respectively. The fan 30 is placed on the heat sink 10. The self-tapping screws 40 extend through the through holes of the lower ears 322 of the fan 30 into the spaces between the two adjacent fins 14 and threadedly engage with the two adjacent fins 14 by self-tapping thereby securely mounting the fan 30 on the heat sink 10. The fasteners 50 extend through the retaining plates 28 of the mounting brackets 20 to engage with a retainer (not shown) located below the PCB, whereby the heat dissipation device is firmly and securely mounted on the PCB. Thus, the mounting brackets 20 of the present invention not only mount the fan 30 onto the heat sink 10 but also mount the heat dissipation device 100 onto the PCB thereby reducing the cost and complexity of the structure of the heat dissipation device.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device, comprising:
   a heat sink having a central core and a plurality of fins extending outwardly from the core;
   a plurality of mounting brackets each comprising a block portion and a baffle plate connecting with and opposite to the block portion, the block portion and the baffle plate sandwiching two adjacent fins therebetween, the baffle plate extending to a bottom of the heat sink and forming a retaining plate extending from a lower end of the baffle plate, a fastener extending through the retaining plate to mount the heat dissipation device on a board; and
   a fan mounted on the heat sink by a plurality of self-tapping screws, each of the self-tapping screws extending through the fan into a space between the two adjacent fins to have a threaded engagement with the two adjacent fins thereby securely mounting the fan to the heat sink.

2. The heat dissipation device as described in claim 1, wherein each of the mounting brackets further comprises a mounting plate mounted on the heat sink, and the mounting plate defines an opening therein communicating with the space between the two adjacent fins.

3. The heat dissipation device as described in claim 2, wherein the block portion and the baffle plate extend from opposite edges of the mounting plate.

4. The heat dissipation device as described in claim 3, wherein the block portion and the baffle plate are parallel to each other, and the retaining plate is perpendicular to the baffle plate.

5. The heat dissipation device as described in claim 4, wherein the retaining plate extends in a direction perpendicular to an extending direction of the mounting plate.

6. The heat dissipation device as described in claim 2, wherein a pair of spring arms extends upwardly from upper edges of the block portion and the baffle plate, the self-tapping screw is sandwiched between the spring arms.

7. The heat dissipation device as described in claim 6, wherein the arms comprise lower arms bent inwardly from the upper edges of the block portion and the baffle plate, and upper arms bent outwardly from upper ends of the lower arms, wherein contact ridges are formed at joints of the lower arms and the upper arms for clamping the self-tapping screw.

8. The heat dissipation device as described in claim 2, wherein the core of the heat sink has a cube-like configuration, and four symmetrical branches extending outwardly from four corners of the core.

9. The heat dissipation device as described in claim 8, wherein the fins project outwardly from side surfaces of the core and the branches, four side surfaces of the core and the four braches form four regions and the fins are divided into four groups oriented at four different directions.

10. The heat dissipation device as described in claim 8, wherein the mounting plates of the mounting brackets are mounted on the branches of the heat sink via a plurality of screws.

11. The heat dissipation device as described in claim 8, wherein mounting spaces are formed between two neighboring groups of the fins for receiving the fasteners therein, and the retaining plates of the mounting brackets extend in the mounting spaces, respectively.

12. The heat dissipation device as described in claim 11, wherein the retaining plates each have two straight sides intersecting each other at a right angle, and an arc-shaped edge interconnecting the two straight sides, the arc-shaped edge being located outside of the two straight sides.

13. A heat sink assembly comprising:
   a heat sink comprising a plurality of fins;
   a plurality of mounting brackets buckled with the fins, each of the mounting brackets comprising a mounting plate mounted on a top of the heat sink to mount a fan onto the heat sink and a baffle plate extending from one side of the mounting plate to a bottom of the heat sink and terminating with a retaining plate bent from a bottom end of the baffle plate; and
   a plurality of fasteners extending through the retaining plates of the mounting brackets without interference with the fins;
   wherein a block portion parallel to the baffle plate extends from another opposite side of the mounting plate, the block portion cooperating with the baffle plate to clasp two adjacent fins therebetween.

14. The heat dissipation device as described in claim 13, wherein a screw extends through the fan and the mounting plate of each of the mounting brackets and into a space between the two adjacent fins to screwedly engage with the two adjacent fins.

15. The heat dissipation device as described in claim 14, wherein the retaining plate is perpendicular to the baffle plate.

* * * * *